United States Patent
Chen et al.

(10) Patent No.: US 10,418,370 B2
(45) Date of Patent: Sep. 17, 2019

(54) FLASH MEMORY HAVING WATER VAPOR INDUCED AIR GAPS AND FABRICATING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Liang Chen, Shanghai (CN); Shengfen Chiu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 133 days.

(21) Appl. No.: 15/331,467

(22) Filed: Oct. 21, 2016

(65) Prior Publication Data

US 2017/0125431 A1    May 4, 2017

(30) Foreign Application Priority Data

Oct. 28, 2015 (CN) .......................... 2015 1 0714032

(51) Int. Cl.
*H01L 27/11524* (2017.01)
*H01L 21/768* (2006.01)
(Continued)

(52) U.S. Cl.
CPC .. *H01L 27/11524* (2013.01); *H01L 21/02164* (2013.01); *H01L 21/02208* (2013.01);
(Continued)

(58) Field of Classification Search
CPC ......... H01L 21/02164; H01L 21/02208; H01L 21/02271; H01L 21/02337;
(Continued)

(56) References Cited

U.S. PATENT DOCUMENTS

2005/0239280 A1  10/2005  Lee
2012/0126302 A1   5/2012  Noda
(Continued)

FOREIGN PATENT DOCUMENTS

CN         1941321 A    4/2007
JP         H0745701 A   2/1995

*Primary Examiner* — Brigitte A Paterson
(74) *Attorney, Agent, or Firm* — Anova Law Group, PLLC

(57) ABSTRACT

In some embodiments, a flash memory and a fabricating method thereof are provided. The method includes proving a substrate including multiple memory transistors and selecting transistors; forming a functional layer covering outer surfaces of the memory transistors and selecting transistors, and surfaces of the substrate between adjacent memory transistors and selecting transistors; performing a surface roughening treatment to the functional layer to provide a roughed surface of the functional layer that absorbs water; and forming a dielectric layer using a chemical vapor deposition (CVD) process, the absorbed water is evaporated from the functional layer during the CVD process to form an upward air flow that resists the deposition of the dielectric layer, such that air gaps are formed between adjacent memory transistors, and the dielectric layer covers top surfaces of the plurality of memory transistors and selecting transistors and fills gaps between each selecting transistor and corresponding adjacent memory transistor.

12 Claims, 4 Drawing Sheets

(51) Int. Cl.
*H01L 21/02* (2006.01)
*H01L 21/311* (2006.01)
*H01L 21/764* (2006.01)
*H01L 27/11534* (2017.01)
*H01L 29/06* (2006.01)
*H01L 29/788* (2006.01)
*H01L 49/02* (2006.01)

(52) U.S. Cl.
CPC .. *H01L 21/02271* (2013.01); *H01L 21/02337* (2013.01); *H01L 21/02359* (2013.01); *H01L 21/31116* (2013.01); *H01L 21/764* (2013.01); *H01L 21/7682* (2013.01); *H01L 27/11534* (2013.01); *H01L 28/00* (2013.01); *H01L 29/0649* (2013.01); *H01L 29/7883* (2013.01)

(58) Field of Classification Search
CPC ......... H01L 21/02359; H01L 21/31116; H01L 21/764; H01L 21/76289; H01L 27/11524; H01L 27/11534; H01L 29/0649; H01L 29/7883
See application file for complete search history.

(56) References Cited

U.S. PATENT DOCUMENTS

| | | |
|---|---|---|
| 2012/0199938 A1 | 8/2012 | Hwang |
| 2012/0241838 A1 | 9/2012 | Nagashima |

FLASH MEMORY HAVING WATER VAPOR INDUCED AIR GAPS AND FABRICATING METHOD THEREOF

CROSS-REFERENCES TO RELATED APPLICATIONS

This application claims the priority of Chinese patent application No. 201510714032.2, filed on Oct. 28, 2015, the entire content of which is incorporated herein by reference.

TECHNICAL FIELD

The present disclosure generally relates to the field of semiconductor technologies and, more particularly, relates to a flash memory and a method for fabricating the flash memory.

BACKGROUND

In the current semiconductor industry, integrated circuit products can be divided into three categories: analog circuits, digital circuits, and digital/analog hybrid circuits. Memory device is one important type of the digital circuits. In recent years, flash memory is particularly rapidly developed in memory device filed. A main feature of the flash memory is that the storage information can be maintained for a long term in an unpowered condition. So flash memories are widely used in rewritable data storages that require a variety of data to be stored without a power supply. Further, flash memory has many other advantages, such as high integration, fast access speed, being apt to erase and rewrite, etc. Therefore, flash memories are also widely used in many areas such as micro-electromechanical systems, automated control systems, etc.

With the development of high-density flash memory technology, the performances of various types of portable electronic devices have been improved. Flash memories are commonly used as the memory devices in such portable electronic devices, including digital cameras, laptops, tablet computers, smart phones, etc. Therefore, reducing the size of the flash memory cells and simultaneously reducing the cost of flash memory become one research direction of the technological development.

However, as the size of the flash memory cells reduces, the pitch between adjacent memory cells becomes smaller. Therefore, the adjacent memory cells may be interfered with each other when reading, writing or erasing operations are performed. Such interferences may result in an unreliable performance of the flash memory.

BRIEF SUMMARY

In accordance with some embodiments of the disclosed subject matter, a flash memory fabricating method is provided.

One aspect of the disclosed subject matter provides a method for fabricating a flash memory, comprising: proving a substrate including a memory cell region; forming a memory transistor array including a plurality of memory transistors, and a plurality of selecting transistors in the memory cell region, wherein each selecting transistor is used for selecting one column of memory transistors in the memory transistor array; forming a functional layer covering outer surfaces of the plurality of memory transistors and selecting transistors, as well as surfaces of the substrate between adjacent memory transistors and selecting transistors; performing a surface roughening treatment to the functional layer to provide a roughed surface of the functional layer that absorbs water; making the roughed surface of the functional layer to absorb water; and forming a dielectric layer using a chemical vapor deposition process on the functional layer, wherein the absorbed water is evaporated from the roughed surface of the functional layer during the chemical vapor deposition process to form an upward air flow that resists the deposition of the dielectric layer, such that air gaps are formed between adjacent memory transistors, and the dielectric layer covers top surfaces of the plurality of memory transistors and selecting transistors and fills gaps between each selecting transistor and corresponding adjacent memory transistor.

In some embodiments, the memory transistor array include a plurality of discrete gate stack structures of the plurality of memory transistors, and a plurality of source regions and drain regions on both sides of the gate stack structures; and each selecting transistor includes a gate structure, a source region and a drain region on both sides of the gate structure; wherein a first gap distance between adjacent gate stack structures of the plurality of memory transistors is smaller than a second gap distance between one gate structure of the selecting transistor and corresponding adjacent gate stack structure of one memory transistor.

In some embodiments, the method further comprises: forming a plurality of logic transistors in a peripheral circuit region of the substrate; and each logic transistor includes a gate structure, a source region and a drain region on both sides of the gate structure; wherein the first gap distance between adjacent gate stack structures of the plurality of memory transistors is smaller than a third gap distance between one gate structure of the selecting transistor and corresponding adjacent gate structure of one logic transistor, and is also smaller than a fourth gap distance between adjacent gate structures of the plurality of logic transistors; and wherein the dielectric layer further covers the top surfaces of the plurality of logic transistors and selecting transistors and fills gaps between each selecting transistor and corresponding adjacent logic transistor, and gaps between adjacent logic transistors.

In some embodiments, making the roughed surface of the functional layer to absorb water is realized by performing a rinse treatment to the functional layer by using deionized water.

In some embodiments, making the roughed surface of the functional layer to absorb water is realized by placing the functional layer in an aqueous environment for 1 day to 10 days.

In some embodiments, a material of the functional layer is silicon oxide; a thickness of the functional layer is in a range from 20 Å to 100 Å; the functional layer is formed by using an atomic layer deposition method; and the surface roughening treatment to the functional layer is a dry etching process.

In some embodiments, an etching gas of the dry etching process is $NF_3$; a gas flow rate of the dry etching process is in a range from 10 mL/min to 50 mL/min; a power of the dry etching process is in a range from 100 W to 500 W; and an etching time of the dry etching process is in a range from 5 s to 10 s.

In some embodiments, the method further comprises: a material of the dielectric layer is silicon oxide; the chemical vapor deposition process that uses tetraethyl orthosilicate or silanel to form the dielectric layer; and a temperature of the chemical vapor deposition process is in a range from 400° C. to 600° C.

In some embodiments, the gate stack structure of each memory transistor, from bottom to top, includes a tunneling dielectric layer, a floating gate, an inner gate dielectric layer, and a control gate; a material of the tunneling dielectric layer is silicon oxide; a material of the floating gate is doped polysilicon; the inter gates dielectric layer is a three-layer structure including silicon oxide, silicon nitride, and nitrogen oxide; and a material of the control gate is doped polysilicon.

In some embodiments, the gate structure each selecting transistor, from bottom to top, includes a gate dielectric layer, a bottom gate electrode, an inner dummy gate dielectric layer, and a selecting gate; the inner dummy gate dielectric layer has an opening, the bottom gate electrode and the selecting gate are electrically connected through the opening; a material of the gate dielectric layer is silicon oxide; a material of the bottom gate is doped polysilicon; the inter dummy gate dielectric layer is a three-layer structure including silicon oxide, silicon nitride, and nitrogen oxide; and a material of the selecting gate is doped polysilicon.

In some embodiments, the gate structure of each logic transistor, from bottom to top, includes a gate dielectric layer, a bottom gate electrode, an inner dummy gate dielectric layer, and a logic gate; the inner dummy gate dielectric layer has an opening, the bottom gate electrode and the logic gate are electrically connected through the opening; a material of the gate dielectric layer is silicon oxide; a material of the bottom gate is doped polysilicon; the inter dummy gate dielectric layer is a three-layer structure including silicon oxide, silicon nitride, and silicon oxide; and a material of the logic gate is doped polysilicon.

In some embodiments, a metal silicide layer is formed on top of the gate stack structure of each memory transistor, the gate structure of each selecting transistor, and the gate structure of each logic transistor; and the control gate, the selecting gate, and the logic gate are word lines.

In some embodiments, the memory transistors and the selecting transistor in the memory cell region, as well as the logic transistors in the peripheral circuit region are formed simultaneously following same fabricating processes.

Another aspect of the disclosed subject matter provides a flash memory, comprising: a substrate including a memory cell region; a memory transistor array including a plurality of memory transistors, and a plurality of selecting transistors in the memory cell region, wherein each selecting transistor is used for selecting one column of memory transistors in the memory transistor array; a functional layer covering outer surfaces of the plurality of memory transistors and selecting transistors, as well as surfaces of the substrate between adjacent memory transistors and selecting transistors, wherein the functional layer has a roughed surface that absorbs water; a dielectric layer covers the top surfaces of the plurality of memory transistors and selecting transistors and fills gaps between each selecting transistor and corresponding adjacent memory transistor; and air gaps between adjacent memory transistors; wherein the dielectric layer is formed by using a chemical vapor deposition process, and the air gaps are formed by evaporating absorbed water from the roughed surface of the functional layer during the chemical vapor deposition process to form an upward air flow that resists the deposition of the dielectric layer.

In some embodiments, the memory transistor array include a plurality of discrete gate stack structures of the plurality of memory transistors, and a plurality of source regions and drain regions on both sides of the gate stack structures; and each selecting transistor includes a gate structure, a source region and a drain region on both sides of the gate structure; wherein a first gap distance between adjacent gate stack structures of the plurality of memory transistors is smaller than a second gap distance between one gate structure of the selecting transistor and corresponding adjacent gate stack structure of one memory transistor.

In some embodiments, the flash memory further comprises: a plurality of logic transistors in a peripheral circuit region of the substrate; and each logic transistor includes a gate structure, a source region and a drain region on both sides of the gate structure; wherein the first gap distance between adjacent gate stack structures of the plurality of memory transistors is smaller than a third gap distance between one gate structure of the selecting transistor and corresponding adjacent gate structure of one logic transistor, and is also smaller than a fourth gap distance between adjacent gate structures of the plurality of logic transistors; and wherein the dielectric layer further covers the top surfaces of the plurality of logic transistors and selecting transistors and fills gaps between each selecting transistor and corresponding adjacent logic transistor, and gaps between adjacent logic transistors.

In some embodiments, a material of the functional layer is silicon oxide;

a thickness of the functional layer is in a range from 20 Å to 100 Å; and a material of the dielectric layer is silicon oxide;

In some embodiments, the gate stack structure of each memory transistor, from bottom to top, includes a tunneling dielectric layer, a floating gate, an inner gate dielectric layer, and a control gate, a material of the tunneling dielectric layer is silicon oxide, a material of the floating gate is doped polysilicon, the inter gates dielectric layer is a three-layer structure including silicon oxide, silicon nitride, and nitrogen oxide, a material of the control gate is doped polysilicon; the gate structure each selecting transistor, from bottom to top, includes a gate dielectric layer, a bottom gate electrode, an inner dummy gate dielectric layer, and a selecting gate, the inner dummy gate dielectric layer has an opening, the bottom gate electrode and the selecting gate are electrically connected through the opening, a material of the gate dielectric layer is silicon oxide, a material of the bottom gate is doped polysilicon, the inter dummy gate dielectric layer is a three-layer structure including silicon oxide, silicon nitride, and nitrogen oxide, a material of the selecting gate is doped polysilicon; and the gate structure of each logic transistor, from bottom to top, includes a gate dielectric layer, a bottom gate electrode, an inner dummy gate dielectric layer, and a logic gate, the inner dummy gate dielectric layer has an opening, the bottom gate electrode and the logic gate are electrically connected through the opening, a material of the gate dielectric layer is silicon oxide, a material of the bottom gate is doped polysilicon, the inter dummy gate dielectric layer is a three-layer structure including silicon oxide, silicon nitride, and silicon oxide, a material of the logic gate is doped polysilicon.

In some embodiments, a metal silicide layer is formed on top of the gate stack structure of each memory transistor, the gate structure of each selecting transistor, and the gate structure of each logic transistor.

Other aspects of the disclosed subject matter can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

Figure 1:
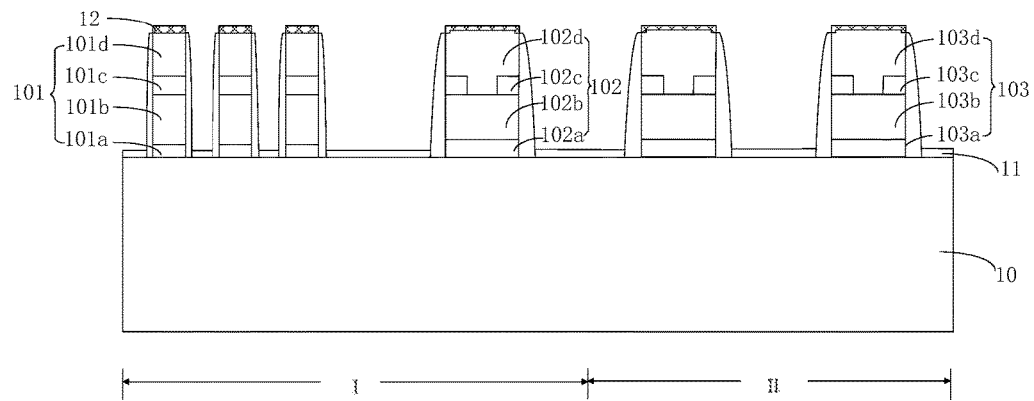
FIGS. 1-6 illustrate cross sectional structures of an exemplary flash memory corresponding to certain stages of an exemplary fabricating process consistent with some embodiments of the disclosed subject matter.

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of one disclosure.

It is apparent that the described embodiments are some but not all of the embodiments of the present invention. Based on the disclosed embodiments, persons of ordinary skill in the art may derive other embodiments consistent with the present disclosure, all of which are within the scope of the present invention.

As described in the background section, with the size reduction of the flash memory cells, the pitch between adjacent memory cells becomes smaller. Therefore, the adjacent memory cells may be interfered from each other when reading, writing or erasing operations are performed. Such interferences may result in an unreliable performance of the flash memory.

Study shows that, a dielectric layer is filled between adjacent flash memory cells to electrically insulate the gate stack structures of the adjacent flash memory cells. A material of the dielectric layer is generally silicon oxide, which may result in a too large parasitic capacitance during the charging and discharging process of the reading, writing, or erasing operations. Thus, a memory cell that is not supposed to be operated may be interfered to change the storage state by an adjacent memory cell that is operated.

Accordingly, the disclosed subject matter provides a flash memory and a fabricating method thereof. In particular, during the dielectric layer depositing process, a high temperature of the depositing process can be used for evaporating the water absorbed in the functional layer to form water vapor. The evaporated water vapor can move upward to form a flow to resist the deposition of the dielectric layer. Therefore, the filling process for forming the dielectric layer can generate multiple air gaps between the gate stack structures of adjacent flash memory cells during the dielectric layer depositing process. As such, the parasitic capacitance can be reduced to avoid interference between adjacent flash memory cells.

In the following, detailed steps of the disclosed flash memory fabricating method are described in connection with figures. FIG. 7 illustrates a flow chart of an exemplary process for fabricating a flash memory in accordance with some embodiments of the disclosed subject matter, and FIGS. 1-6 illustrate cross sectional structures of an exemplary flash memory corresponding to certain stages of the exemplary fabricating process.

As illustrated in FIG. 7, at step 701, a substrate including a memory cell region and a peripheral circuit region can be provided. A memory transistor array and multiple selecting transistors can be formed in the memory cell region, and multiple logic transistors can be formed in the peripheral circuit region.

Referring to FIG. 1, a substrate 10 can be provided. The substrate 10 includes a memory cell region I and the peripheral circuit region II. The memory cell region can include a memory transistor array, and multiple selecting transistors 102. Each selecting transistor can be used for selecting one row or one column of the memory transistors in the memory transistor array. The peripheral circuit region II can include multiple logic transistors.

The memory transistor array includes multiple discrete gate stack structures 101 and source and drain regions (not shown in the figures) located on both sides of the gate stack structures 101. Each selecting transistor 102 includes a gate structure 102 and source and drain regions (not shown in the figure) located on both sides of the gate structure 102. The logic transistor includes a gate structure 103 and source and drain regions (not shown in the figure) located on both sides of the gate structure 103.

In some embodiments, the substrate 10 can be any suitable semiconductor substrate, such as a silicon substrate, a silicon on insulator (SOI) substrate, etc.

Specifically, as illustrated in FIG. 1, the gate stack structures 101 of the memory transistors in the memory cell region I have a relatively small density, so that adjacent gate stack structures 101 has a relatively small gap. The gaps between the gate structure 102 of each selecting transistor and corresponding gate stack structure 101 of one adjacent memory transistors, the gaps between the gate structure of each selecting transistor and corresponding gate structure 103 of one adjacent logic transistor, and the gaps between adjacent gate structures 103 of the logic transistors, are relatively large.

As illustrated in FIG. 1, the gate stack structure 101 of each memory transistor, from bottom to top, can include a tunneling dielectric layer 101a, a floating gate 101b, an inner gate dielectric layer 101c, and a control gate 101d. In some embodiments, a material of the tunneling dielectric layer 101a is silicon oxide, a material of the floating gate 101b is doped polysilicon. The inter gates dielectric layer 101c is a three-layer structure including silicon oxide, silicon nitride, and nitrogen oxide (ONO). A material of the control gate 101d is also doped polysilicon.

As illustrated in FIG. 1, the gate structure 102 of each selecting transistor, from bottom to top, can include a gate dielectric layer 102a, a bottom gate electrode 102b, an inner dummy gate dielectric layer 102c, and a selecting gate 102d. The inner dummy gate dielectric layer 102c has an opening, the bottom gate electrode 102b and the selecting gate 102d are electrically connected through the opening. In some embodiments, a material of the gate dielectric layer 102a is silicon oxide, a material of the bottom gate 102b is doped polysilicon. The inter dummy gate dielectric layer 102c is a three-layer structure including silicon oxide, silicon nitride, and nitrogen oxide (ONO). A material of the selecting gate 102d is also doped polysilicon.

As illustrated in FIG. 1, the gate structure 103 of each logic transistor, from bottom to top, can include a gate dielectric layer 103a, a bottom gate electrode 103b, an inner dummy gate dielectric layer 103c, and a logic gate 103d. The inner dummy gate dielectric layer 103c has an opening, the bottom gate electrode 103b and the logic gate 103d are electrically connected through the opening. In some embodiments, a material of the gate dielectric layer 103a is silicon oxide, a material of the bottom gate 103b is doped polysilicon. The inter dummy gate dielectric layer 103c is a three-layer structure including silicon oxide, silicon nitride, and silicon oxide (ONO). A material of the logic gate 103d is also doped polysilicon.

In an exemplary fabricating process, the gate stack structures 101, and the gate structures 102, 103 can be made by the following steps.

First, the tunneling dielectric layer 101a, and the gate dielectric layers 102a, 103a can be formed in a same layer by a same process. A silicon oxide layer can be thermally oxidized or deposited on the semiconductor substrate. A thickness difference between the tunneling dielectric layer 101a and the gate dielectric layer 102a or 103a can be predetermined. Then, a patterned photoresist layer can be formed to cover a predetermined region in the memory cell region I that is to be formed as the selecting transistors, and to cover the silicon oxide in the peripheral circuit region II. By using the patterned photoresist layer as a mask, the silicon oxide in the memory transistor region can be dry etched to expose the surface of the semiconductor substrate. Then, the remaining photoresist layer can be ashed and removed. Next, an additional silicon oxide layer can be deposited on the remaining silicon oxide and the exposed surface of the semiconductor substrate. A thickness of the additional silicon oxide layer can meet the requirement of the tunneling dielectric layer 101a. As such, a first silicon oxide layer having a first thickness can be formed in the predetermined regions of memory cell region I that are used to be formed as memory transistors. A second silicon oxide layer having a second thickness can be formed in the predetermined region of memory cell region I that is used to be formed as the selecting transistors, and in the peripheral circuit region II.

Then, a first doped polysilicon layer can be deposited on the first silicon oxide layer and the second silicon oxide layer. A three-layer structure including silicon oxide, silicon nitride, and silicon oxide (ONO) can be deposited sequentially from bottom to top on the first doped polysilicon layer. Multiple openings can then be dry etched in the ONO three-layer structure to expose the first doped polysilicon layer. The positions of the multiple openings can be located in the predetermined regions that are used to be formed as the gate structures of the selecting transistors and the logic transistors. Then a second doped polysilicon layer can be formed in the multiple openings.

After that, a hard mask layer can be deposited on the second doped polysilicon layer. A material of the hard mask layer can be silicon oxide. The hard mask layer cam be patterned. Using the patterned hard mask layer as a mask, the formed multi-layer structure including the second layer of doped polysilicon, the ONO three-layer structure, the first doped polysilicon layer and the silicon oxide can be dry etched to form discrete multiple gate stack structures 101 of the memory transistors, the gate structures 102 of the selecting transistors, and the gate structures 103 of the logic transistors.

During the dry etching process to form the gate stack structures 101 and the gate structures 102, 103, the second doped polysilicon layer can also be etched to form word lines.

Next, iron implantation processes can be performed respectively to the memory cell region I and the peripheral circuit region II of the semiconductor substrate to form corresponding source and drain regions (not shown in the figures) of the memory transistors, the selecting transistors, and the logic transistors.

The ion implantation processes can include a shallow depth ion implantation process and a deep depth ion implantation process. The shallow ion implantation process can be performed by using the gate stack structures 101 of the memory transistors, the gate structure 102 of the selection transistor, and the gate structures 103 of the logic transistors as masks. After performing the shallow ion implantation process, side walls (not shown in the figures) can be formed on both sides of the gate stack structures 101 of the memory transistors, the gate structure 102 of the selection transistor, and the gate structures 103 of the logic transistors respectively. The deep ion implantation process can be performed by using the side walls as masks.

During the shallow depth ion implantation process and the deep depth ion implantation process, buffer oxide layer 11 may be formed on the surface of the semiconductor substrate surface. A material of the buffer oxide layer 11, for example, can be silicon oxide. The buffer oxide layer 11 can be used to protect the surface of the semiconductor substrate during the shallow depth ion implantation process and the deep depth ion implantation process.

Still referring to FIG. 1, metal silicide 12 can then be formed on the top portions of the gate stack structures 101 of the memory transistors, the gate structures 102 of the selecting transistors, and the gate structure 103 of the logic transistor 103.

In a specific implementation process, a pickling process can be firstly performed to remove the oxidized surface of the doped polysilicon. The pickling process can remove upper portions of the side walls to expose the upper portions of the gate stack structures 101 of the memory transistors, the gate structures 102 of the selecting transistors, and the gate structure 103 of the logic transistor 103.

Next, a metal material can be deposited on the exposed sidewalls of the upper portions of the gate stack structures 101 of the memory transistors, the gate structures 102 of the selecting transistors, and the gate structure 103 of the logic transistor 103, as well as the remaining lower portions of the side walls, and the buffer oxide layer 11.

In one embodiments, the metal material can be nickel. In some other embodiments, the metal material may be cobalt, titanium, or tungsten. After a high temperature silicifying process, the metal material can form the metal silicide 12. At last, the remaining metal that is not silicified can be removed by washing.

Since the gate stack structures 101 of the memory transistors have relatively small widths, the exposed upper portions of the gate stack structures 101 of the memory transistors can be fully converted into metal silicide 12. The gate structures 102 of the selecting transistors and the gate structures 103 of the logic transistors have relatively large widths, certain thickness surfaces of the exposed upper portions of the gate structures 102 of the selecting transistors and the gate structures 103 of the logic transistors may be converted into metal silicide 12.

Turning back to FIG. 7, at step 703, a functional layer can be formed to cover the memory transistor array, the selecting transistors, and the logic transistors, as well as the substrate surfaces between adjacent memory transistors, selecting transistors, and logic transistors.

Figure 2:
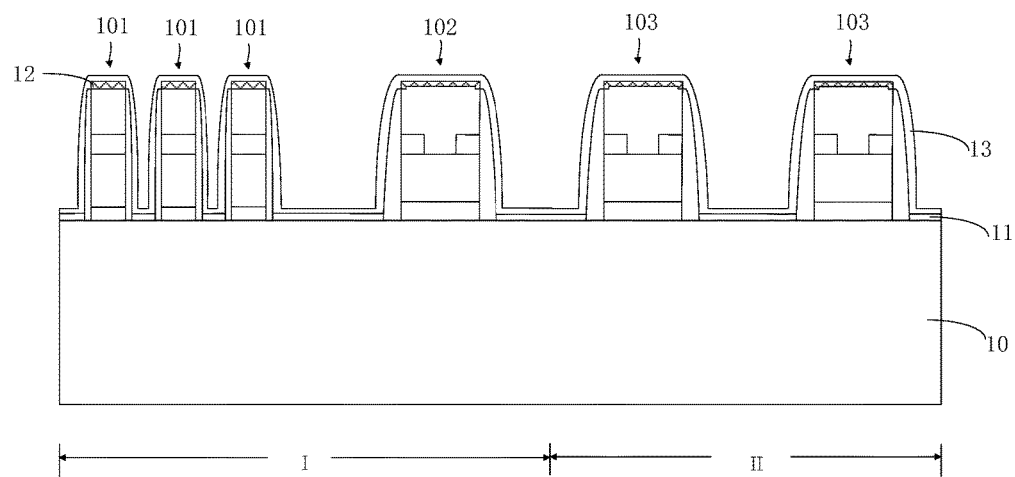

Referring to FIG. 2, a functional layer 13 can be formed by using an atomic layer deposition (ALD) method on the outer surfaces of the gate stack structures 101 of the memory transistor array, the gate structures 102 of the selecting transistors and the gate structures 103 of the logic transistors, and the exposed surfaces of the semiconductor substrate that are between adjacent gate stack structures 101, and/or gate structures 102, 103.

In one embodiments, the buffer oxide layer 11 is covering the exposed surfaces of the semiconductor substrate that are between adjacent gate stack structures 101, and/or gate structures 102, 103. Thus, the functional layer 13 is formed on the buffer oxide layer 11. In some other embodiments, the functional layer 13 can be directly formed on the exposed surfaces of the semiconductor substrate that are between adjacent gate stack structures 101, and/or gate structures 102, 103.

In a specific implementation process, a material of the functional layer 13 may be silicon oxide, and a thickness of the functional layer 13 may be in a range from 20 Å to 100 Å. The reason that the functional layer 13 is formed by using the atomic layer deposition (ALD) method has two aspects. On one aspect, the functional layer 13 formed on the surfaces of the semiconductor substrate between adjacent gate stack structures 101 of the memory transistor array having relatively small gaps can have a uniform thickness. On the other aspect, the formed functional layer 13 can be relatively thin, and may fully fill the gaps between adjacent gate stack structures 101 of the memory transistor array.

Turning back to FIG. 7, at step 705, a surface roughening treatment can be performed in the functional layer.

Figure 3:
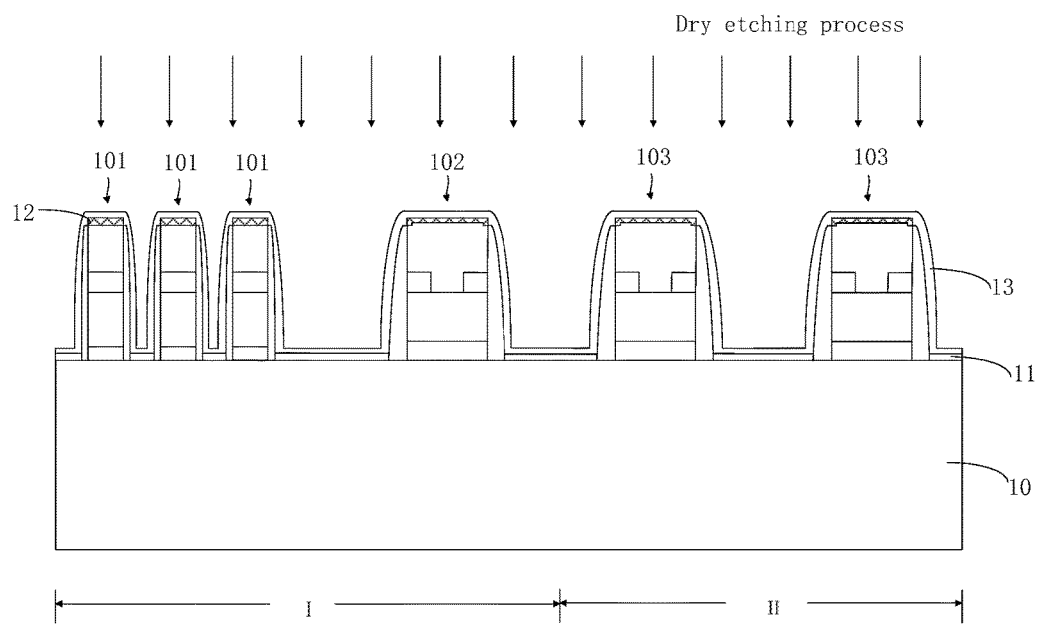

Referring to FIG. 3, the functional layer 13 can be surface roughened to form a rough surface that can easily absorb water.

In an exemplary implementation process, the surface roughening treatment can be achieved by using a dry etching process. Specifically, by selecting the dry etching gas, controlling the dry etching air flow, power, and etching time, the outer surface of the functional layer 13 can be slightly etched to form a rough surface that can easily absorb water. In one embodiment, the dry etching gas can be $NF_3$, the gas flow rate can be in a range from 10 mL/min to 50 mL/min, the power can be in a range from 100 W to 500 W, and an etching time can be in a range from 5 s to 10 s.

Turning back to FIG. 7, at step 707, the surface of the functional layer can absorb water.

Figure 4:
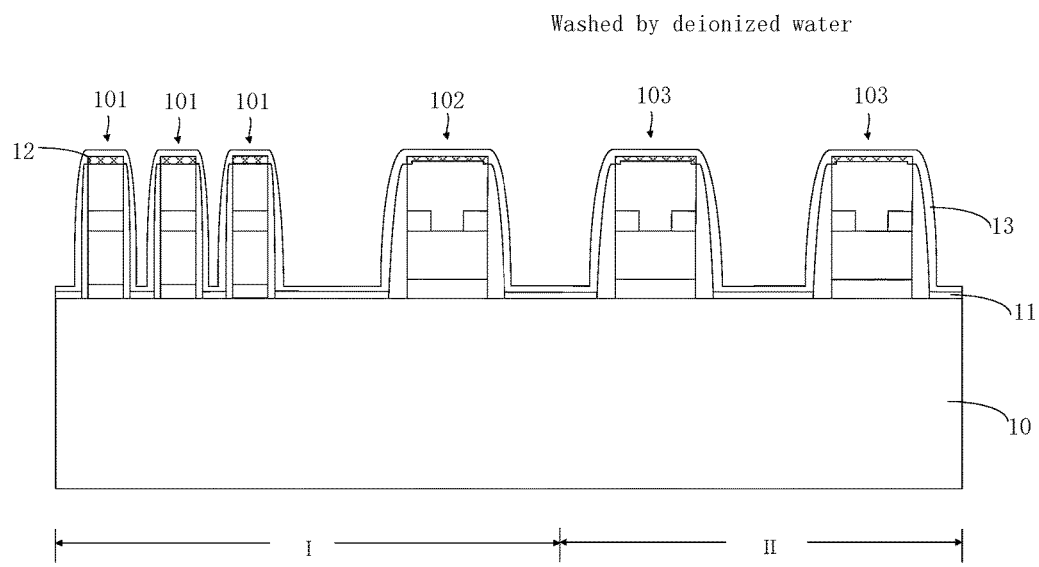

Referring to FIG. 4, the rough surface of the functional layer 13 can absorb water. In some embodiments, the step can be realized by performing a rinse treatment to the functional layer 13 by using deionized water. In some other embodiments, the step can be realized by placing the functional layer 13 in an aqueous environment for 1 day to 10 days. The aqueous environment can be a clean room, and the functional layer 13 can absorb the atmospheric moisture.

Turning back to FIG. 7, at step 709, a dielectric layer can be formed on the functional layer. The dielectric layer can fill the gaps between the gate structure 102 of each selecting transistor and one corresponding gate stack structure 101 of one adjacent memory transistor, between the gate structure 102 of each selecting transistor and one corresponding gate structures 103 of one adjacent logic transistor, and between adjacent gate structures 103 of the logic transistors. In the meantime, air gaps can be formed between adjacent gate stack structures 101 of the memory transistors.

Figure 5:
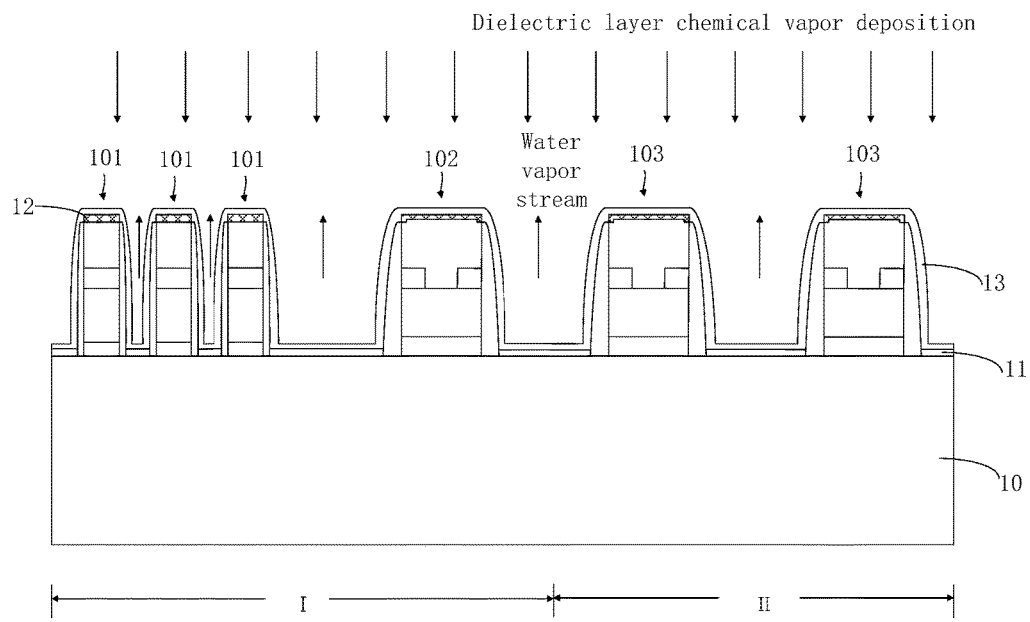

Referring to FIG. 5, a dielectric layer 14 can be formed on the water-absorbed functional layer 13 by using a chemical vapor deposition (CVD) process. In some embodiments, the chemical vapor deposition can use tetraethyl orthosilicate (TEOS) or silane to form a silicon oxide dielectric layer 14. A deposition process temperature can be in a range from 400° C. to 600° C. The deposition process temperature can evaporate the absorbed water by the functional layer 13 to form an upward air flow. The upward air flow can prevent the deposition of the dielectric layer 14, thereby providing a poor performance of the filling process of the dielectric layer 14.

Referring to FIG. 4, the gaps between the gate structure 102 of each selecting transistor and one corresponding gate stack structure 101 of one adjacent memory transistor, between the gate structure 102 of each selecting transistor and one corresponding gate structure 103 of one adjacent logic transistor, and between adjacent gate structures 103 of the logic transistors are relatively large. Therefore, even the filling process of the dielectric layer 14 has a poor performance, the dielectric layer 14 can fill the above described gaps.

However, the gaps between adjacent gate stack structures 101 of the memory transistors are relatively small. When the filling process of the dielectric layer 14 has a poor performance, the dielectric layer 14 can only cover the top portions of the gate stack structures 101 of the memory transistors. Therefore, air gaps can be formed between adjacent gate stack structures 101 of the memory transistors.

Figure 6:
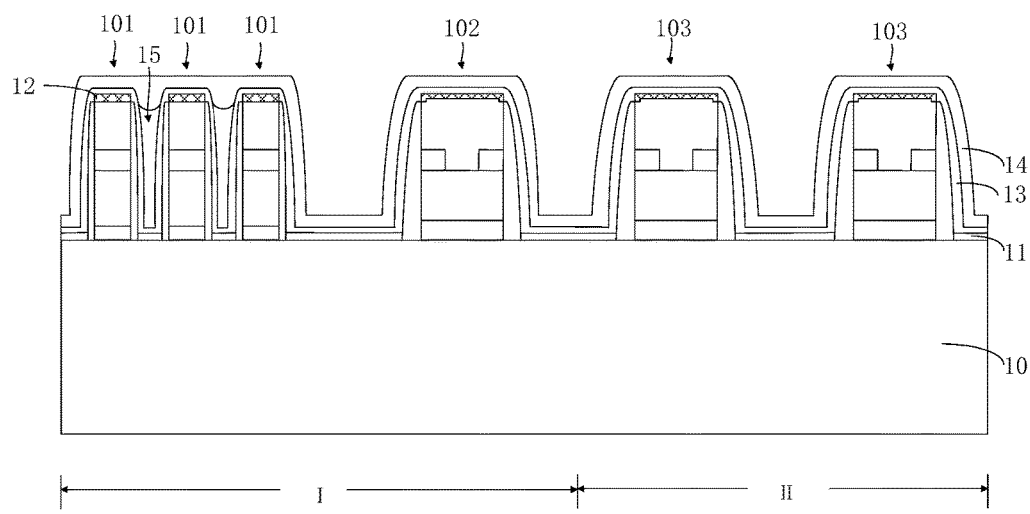
Figure 7:
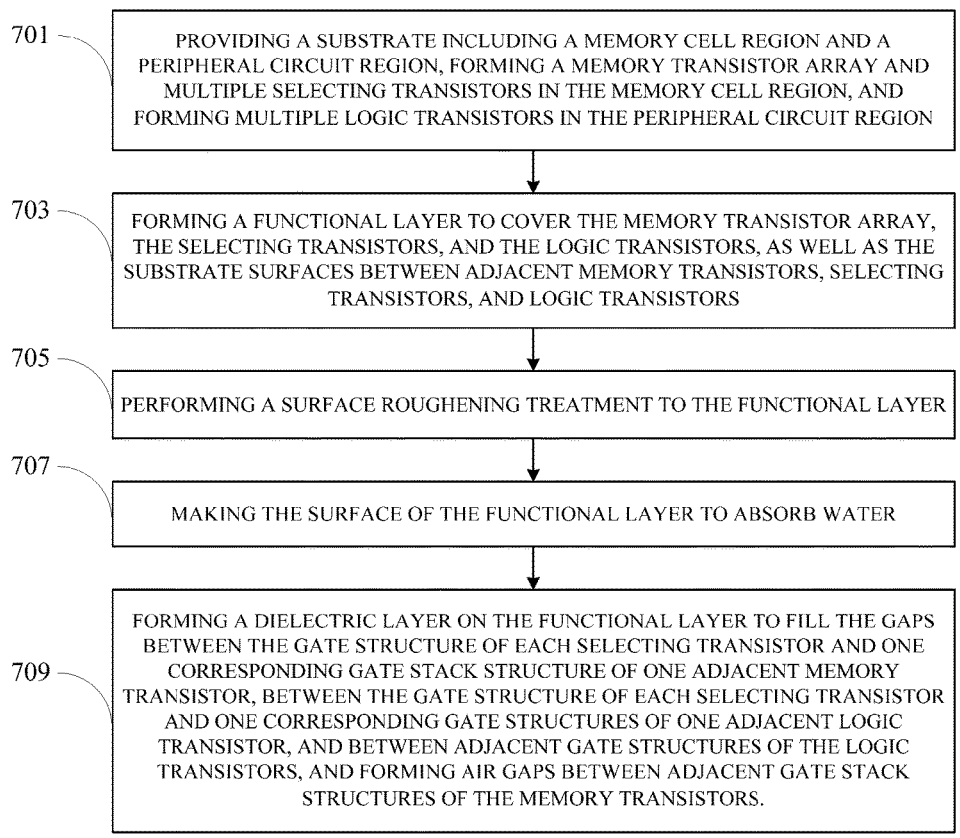
FIG. 7 illustrates a flow chart of an exemplary process for fabricating a flash memory in accordance with some embodiments of the disclosed subject matter.

Accordingly, as illustrated in FIG. 6, the formed dielectric layer 14 can cover the top surfaces of the gate stack structures 101 of the memory transistors, the gate structures 102 of the selecting transistors, and the gate structures 103 of the logic transistor. Further, the formed dielectric layer 14 can fill the gaps between the gate structure 102 of each selecting transistor and one corresponding gate stack structure 101 of one adjacent memory transistor, between the gate structure 102 of each selecting transistor and one corresponding gate structure 103 of one adjacent logic transistor, and between adjacent gate structures 103 of the logic transistors. In the meantime, air gaps can be formed between adjacent gate stack structures 101 of the memory transistors.

It should be noted that, in the above-described embodiments, the memory transistors and the selecting transistors in the memory cell region I, as well as the logic transistors in the peripheral circuit region II are formed simultaneously following the same fabricating processes. In some other embodiments, the memory transistors and the selecting transistors in the memory cell region I, and the logic transistors in the peripheral circuit region II can be respectively formed by different fabricating processes.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, a flash memory and a fabricating method thereof are provided.

Although the disclosed subject matter has been described and illustrated in the foregoing illustrative embodiments, it is understood that one disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of one disclosure.

What is claimed is:

1. A method for fabricating a flash memory, comprising:
providing a substrate including a memory cell region;
forming a memory transistor array including a plurality of memory transistors, and a plurality of selecting transistors in the memory cell region, wherein each selecting transistor is used for selecting one column of memory transistors in the memory transistor array;
forming a functional layer covering outer surfaces of the plurality of memory transistors and outer surfaces of the plurality of selecting transistors, as well as surfaces of the substrate between adjacent memory transistors and selecting transistors;
performing a surface roughening treatment to the functional layer to provide a surface of the functional layer, the roughened surface being able to absorb water;
absorbing by the roughened surface of the functional layer, introduced water; and
forming a dielectric layer using a chemical vapor deposition process on the functional layer, wherein the absorbed water is evaporated from the roughened surface of the functional layer during the chemical vapor deposition process to form an upward air flow that resists the deposition of the dielectric layer, such that air gaps are formed between adjacent memory transistors, and the dielectric layer covers top surfaces of the plurality of memory transistors and selecting transistors and fills gaps between each selecting transistor and a corresponding adjacent memory transistor.

2. The method of claim 1, wherein:
the memory transistor array includes a plurality of first gate stack structures of the plurality of memory transistors, and a plurality of first source regions and drain regions on both sides of the first gate stack structures; and
each selecting transistor includes a second gate structure, a second source region and a second drain region on both sides of the second gate structure;
wherein a first gap distance between adjacent first gate stack structures of the plurality of memory transistors is smaller than a second gap distance between one second gate structure of the selecting transistor and a corresponding adjacent first gate stack structure of one memory transistor.

3. The method of claim 2, further comprising:
forming a plurality of logic transistors in a peripheral circuit region of the substrate; and
each logic transistor includes a third gate structure, a third source region and a third drain region on both sides of the third gate structure;
wherein the first gap distance between adjacent first gate stack structures of the plurality of memory transistors is smaller than a third gap distance between one second gate structure of the selecting transistor and a corresponding adjacent third gate structure of one logic transistor, and is also smaller than a fourth gap distance between adjacent third gate structures of the plurality of logic transistors; and
wherein the dielectric layer further covers the top surfaces of the plurality of logic transistors and the plurality of selecting transistors and fills gaps between each selecting transistor and a corresponding adjacent logic transistor, and fills gaps between adjacent logic transistors.

4. The method of claim 1, wherein absorbing by the roughened surface of the functional layer the introduced water is realized by placing the functional layer in an aqueous environment for 1 day to 10 days.

5. The method of claim 1, wherein:
a material of the functional layer is silicon oxide;
a thickness of the functional layer is in a range from 20 Å to 100 Å;
the functional layer is formed by using an atomic layer deposition method; and
the surface roughening treatment to the functional layer is a dry etching process.

6. The method of claim 5, wherein:
an etching gas of the dry etching process is $NF_3$;
a gas flow rate of the dry etching process is in a range from 10 mL/min to 50 mL/min;
a power of the dry etching process is in a range from 100 W to 500 W; and
an etching time of the dry etching process is in a range from 5 s to 10 s.

7. The method of claim 1, wherein:
a material of the dielectric layer is silicon oxide;
the chemical vapor deposition process uses tetraethyl orthosilicate or silanel to form the dielectric layer; and
a temperature of the chemical vapor deposition process is in a range from 400° C. to 600° C.

8. The method of claim 3, wherein:
the first gate stack structure of each memory transistor, from bottom to top, includes a first tunneling dielectric layer, a first floating gate, a first inner gate dielectric layer, and a control gate;
a material of the first tunneling dielectric layer is silicon oxide;
a material of the first floating gate is doped polysilicon;
the first inner gate dielectric layer is a first three-layer structure including silicon oxide, silicon nitride, and nitrogen oxide; and
a material of the control gate is doped polysilicon.

9. The method of claim 8, wherein:
the second gate structure of each selecting transistor, from bottom to top, includes a second gate dielectric layer, a second bottom gate electrode, a second inner dummy gate dielectric layer, and a selecting gate;
the inner dummy gate dielectric layer has a second opening, the second bottom gate electrode and the selecting gate are electrically connected through the second opening;
a material of the second gate dielectric layer is silicon oxide;
a material of the second bottom gate is doped polysilicon;
the second inner dummy gate dielectric layer is a second three-layer structure including silicon oxide, silicon nitride, and nitrogen oxide; and
a material of the selecting gate is doped polysilicon.

10. The method of claim 9, wherein:
the third gate structure of each logic transistor, from bottom to top, includes a third gate dielectric layer, a third bottom gate electrode, a third inner dummy gate dielectric layer, and a logic gate;
the third inner dummy gate dielectric layer has a third opening, the third bottom gate electrode and the logic gate are electrically connected through the third opening;
a material of the third gate dielectric layer is silicon oxide;
a material of the third bottom gate is doped polysilicon;
the third inner dummy gate dielectric layer is a third three-layer structure including silicon oxide, silicon nitride, and silicon oxide; and
a material of the logic gate is doped polysilicon.

11. The method of claim 10, wherein:
a metal silicide layer is formed on top of the first gate stack structure of each memory transistor, the second gate structure of each selecting transistor, and the third gate structure of each logic transistor; and
the control gate, the selecting gate, and the logic gate are word lines.

12. The method of claim 3, wherein:
the memory transistors and the selecting transistor in the memory cell region, as well as the logic transistors in the peripheral circuit region are formed simultaneously during same fabricating processes.

\* \* \* \* \*